WASHED EMITTER METHOD FOR IMPROVING PASSIVATION OF A TRANSISTER

Filed Oct. 23, 1969

INVENTOR
TAKAAKI MORI, HISAYUKI HIGUCHI and
KEIJIRO UEHARA
BY Craig, Antonelli, Stewart & Hill
ATTORNEYS Sept. 18, 1973 TAKAAKI MORI ET AL 3,759,761

WASHED EMITTER METHOD FOR IMPROVING PASSIVATION OF A TRANSISTER

Filed Oct. 23, 1969 2 Sheets-Sheet 2

INVENTORS
TAKAAKI MORI, HISAYUKI HIGUCHI and
KEIJIRO UEHARA
BY
Craig, Antonelli, Stewart & Hill
ATTORNEYS United States Patent Office 3,759,761

Patented Sept. 18, 1973

3,759,761

WASHED EMITTER METHOD FOR IMPROVING PASSIVATION OF A TRANSISTOR

Takaaki Mori, Hachioji-shi, Hisayuki Higuchi, Kokubunji-shi, and Keijiro Uehara, Tokyo, Japan, assignors to Hitachi, Ltd., Tokyo, Japan Filed Oct. 23, 1969, Ser. No. 868,869
Claims priority, application Japan, Oct. 23, 1968, 43/76,767
Int. Cl. C23b *5/50;* C23c *13/04;* H01l *7/44*
U.S. Cl. 148—187 22 Claims

ABSTRACT OF THE DISCLOSURE

An improved method for fabricating a transistor based on the "washed emitter method," wherein an original silicon dioxide film, used as a mask for base diffusion, is removed from the surface of the silicon transistor body after a base region is formed by diffusion and a new insulation film which operatively acts to stabilize the surface property of the transistor body is substituted therefor.

Emitter diffusion is then provided to the surface of the base region by utilizing the new insulator film as a mask for the emitter diffusion, and thereafter the surface of the body is washed to remove the oxide layer formed on the emitter region during the emitter diffusion.

An aperture for a base contact is then formed by photoetching a part of the new insulator film. A completed transistor is obtained by providing metal contacts through the respective apertures to the respective emitter and base regions.

FIELD OF THE INVENTION

This invention relates to a method for fabricating a transistor device. More specifically the invention relates to a novel method adapted for the manufacture of a transistor useful in high frequency applications.

DESCRIPTION OF THE PRIOR ART

Transistors for high frequency use require highly sophisticated photo-etching techniques because of the small size of the emitter regions. These small emitter regions require hairline accuracy in forming apertures through the insulating film covering the emitter region to provide emitter contact. A simplified method, known as the "washed emitter method," for forming apertures through the insulating film to provide emitter contact, has been used for the fabrication of transistors with particularly small emitter regions.

The washed emitter method takes advantage of the phenomenon that, when emitter impurities are diffused into a semiconductor body through an aperture in an insulator mask formed over the semiconductor body, the impurities diffuse not only in a direction normal to the semiconductor surface, but also across the surface of the semiconductor so that the emitter region formed is larger in size than the aperture. During the diffusion of the emitter impurity an insulating layer is formed on the surface of the emitter region. Thus, this method is characterized by the fact that after the diffusion of the emitter impurity into the semiconductor body through the emitter aperture formed in the insulator mask, the insulating layer formed on the surface of the emitter region during the diffusion is completely washed away with an etchant instead of by any special masking means, and thus the aperture used for diffusing the emitter impurity is then directly utilized as the aperture for emitter contact. The method has the advantage that a transistor provided with a minute emitter can be easily and accurately made because the aperture for emitter contact does not have to be formed by photo-etching. Only the aperture for the base contact has to be formed by a photo-etching technique.

However, as is the case with other conventional transistors, the practice as described above, which makes use of the original insulator film formed over the semiconductor body as a mask for the impurity diffusion in both the base and emitter regions, and eventually as a protective film for surface stabilization of the end product transistor, has the following shortcomings.

In the fabrication of an NPN type silicon transistor phosphorous is conventionally used as the impurity for providing the emitter region. It is well known that diffusion of phosphorous into a semiconductor having a silicon dioxide film on the surface leads to compounding of phosphorous with silicon dioxide and hence results in formation of a phosphosilicate glass layer over the silicon dioxide film. This phosphosilicate layer is extremely beneficial for surface passivation of the transistor. It would therefore be very advisable for the passivation of the surface property of the resulting transistor element not to remove this phosphosilicate glass layer from the silicon dioxide film. However, in the washed emitter method this useful phosphosilicate glass layer is removed simultaneously with the phosphosilicate glass from the surface of the emitter region at the time of the emitter region with the result that the passivation effect once achieved is thereby lost.

Even if the phosphosilicate glass could be left in a meager amount on the silicon dioxide film, the ordinary washed emitter method would still have a disadvantage. Since the phosphosilicate glass is formed at the time of diffusion of the emitter impurity, it contains phosphorus in a very high concentration. In addition, the etching speed of phosphosilicate glass by the etchant is much higher than that of silicon dioxide film. Thus, when an aperture for the emitter contact is formed by the washed emitter method in the manner described above and a photo-resist film is applied on the remaining phosphosilicate glass and then the silicon dioxide film is subjected to photo-etching to form an aperture for the base contact, the phenomenon of side etching tends to occur in the remaining portion of phosphosilicate glass, thus seriously affecting the processing accuracy. It has been extremely difficult to manufacture transistors which feature passivated surface properties of the semiconductor substrates and also high frequency applications.

SUMMARY OF THE INVENTION

The present invention has for its principal object a method for fabricating a transistor for high frequency use which incorporates a novel washed emitter method free from the disadvantages of the conventional technique as above described.

The essence of the present invention for realizing the above object resides in that, specifically after the impurity diffusion treatment through an insulator film having an aperture to form a base region on a semiconductor body, the original insulator film remaining on the surface of the semiconductor body is removed and a new insulator film is formed instead, and then another impurity diffusion treatment is carried out through an aperture provided to form an emitter through the insulator film, and at the same time the aperture is utilized for the connection with the emitter contact.

As the new insulator film, a film having a passivation effect for the semiconductor surface property is specifically used in accordance with the present invention. It may be either of a monolayer or multilayer construction provided that the film is capable of being formed over the surface of the semiconductor body at a relatively low temperature, preferably at a temperature low enough to avoid the deformation of the base region preformed in the silicon body due to the rediffusion of the impurity, and that it has a passivation effect for the semiconductor surface property and has no possibility of side etching at the time of forming the aperture for the base contact. An example of monolayer film that satisfies these conditions is a film of silicon nitride. Useful multilayer films include a film consisting of silicon dioxide and phosphosilicate glass layers, and some other films of silicon dioxide layer-alumina layer, silicon dioxide layer-silicon nitride, silicon dioxde-borosilicate glass layer-phosphosilicate glass layer combinations.

For a better understanding of the constitution and features of the present invention, a detailed description of the invention will be made hereunder with reference to the accompanying drawing showing a specific embodiment. This invention will be described as embodied in an NPN type silicon transistor which is a most common type of high frequency transistors.

DESCRIPTION OF THE PREFERRED EMBODIMENTS

Figures 1, 2, 3, 4, 5, 6:
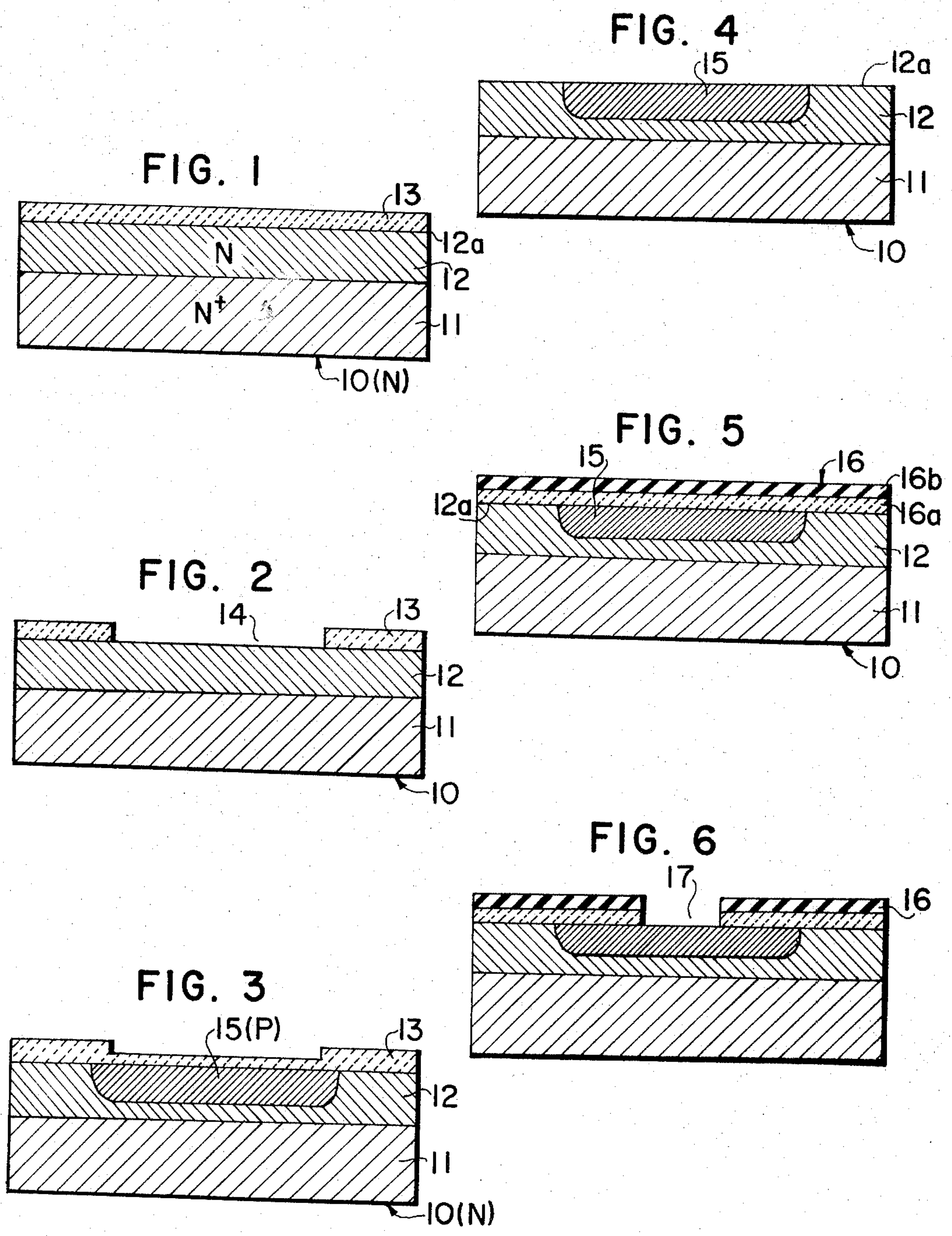
FIGS. 1 to 11 show sectional views of an NPN type transistor in a sequence of processing steps for the fabrication in accordance with the present invention.

FIG. 1 shows a silicon body 10 of a double-layer structure prepared by forming an N type epitaxial layer 12 having a specific resistance of about 0.1 Ω-cm. to a thickness of approximately 1 to 2$\mu$ over the surface of an N type silicon single crystal substrate 11 having a specific resistance of about 0.005 Ω-cm. The silicon body 10 is to constitute the collector region of the resulting transistor. In the figure, the substrate 11 is marked with a symbol "N+" in the sense that the impurity concentration therein is higher than in the epitaxial layer 12. The surface 12*a* of the epitaxial layer 12 is covered with a silicon dioxide ($SiO_2$) film 13, about 0.4$\mu$ in thickness, which is formed by oxidizing the silicon body 10 at a temperature of about 1000° C.

According to the present invention, the insulator film formed initially on the surface of the semiconductor body, such as the silicon dioxide 13, is intended to serve only as a mask for impurity diffusion to form the base region for the transistor. Thus, as shown in FIG. 2, an aperture 14 is formed in the silicon dioxide film 13 for base diffusion by a known photo-etching technique. A P type impurity, e.g., boron, is then diffused through the aperture into the surface portion of the silicon body 10, until a base region 15 is formed as in FIG. 3. Next, the silicon dioxide film 13 is completely removed from the surface of the silicon body, as illustrated in FIG. 4. For its removal, an etchant such as hydrofluoric acid is applied. This means that the base region 15 is temporarily exposed flush with the surface 12*a* of the silicon body 10. The region 15 is formed to a depth of about 0.5$\mu$ and a surface impurity concentration of about $2\times10^{19}$ atoms/cc.

The present invention is characterized by the ensuing step of forming a new insulator film 16 on the surface 12*a* of the silicon body 10 which serves as a mask for subsequent emitter diffusion and also as a film for permanent passivation of the surface property of the resulting transistor. While the insulator film 16 may be of a monolayer construction if adequate passivation of the surface property is thereby achieved for practical use without the hazard of side etching, it is generally by a multilayer construction that an excellent passivation effect is obtained. In order to attain a high degree of surface stabilization, it is desirable to form the insulator film 16 on an adequately clean silicon surface, for instance by thoroughly washing the surface 12*a* of the silicon body 10 with distilled water, lightly etching the surface of the silicon body with an etchant consisting of acids, e.g., hydrofluoric acid (HF) and nitric acid ($HNO_3$) at a mixing ratio by weight of 3:5, and then washing the surface again with distilled water.

In FIG. 5 there is illustrated an example of the insulator film 16 as above described which is of double-layer structure, composed of a first layer 16*a* and a second layer 16*b*. As a typical combination of components for the insulator film 16, the embodiment shown uses silicon dioxide for the first layer 16*a* and phosphosilicate glass for the second layer 16*b* because of the excellent passivation effect which the compounds jointly exert upon the surface property of the transistor to be obtained.

A procedure which appears particularly desirable in forming the insulator film 16 of the above combination is to form, at first, a silicon dioxide ($SiO_2$) layer 16*a* by thermal decomposition of monosilane ($SiH_4$) on the cleaned surface 12*a* of the silicon body and then form a phosphosilicate glass ($SiO_2/P_2O_5$) layer 16*b* on the $SiO_2$ layer 16*a* by the oxidation reaction between the monosilane and phosphine ($PH_3$). In this manner the insulator film 16 can be formed at a low temperature of less than 400° C. Also, the phosphorus concentration in the phosphosilicate glass layer 16*b* can be freely controlled by adjusting the quantity of phosphine for the oxidation reaction. This permits a reduction of the phosphorus concentration to a sufficiently low level for achieving an adequate surface passivation effect with no adverse influence upon the processing accuracy resulting from side etching during the subsequent stage where the aperture for the base contact is formed. For the substantial elimination of the undesirable outcome of side etching, it is only necessary to limit the etching speed of the phosphosilicate glass layer 16*b* within a range up to twice the etching speed of the $SiO_2$ layer 16*a*. For practical purposes the phosphorus concentration in the phosphosilicate glass layer 16*b* may be about 2 mol percent.

The $SiO_2$ layer 16*a* is required to have a sufficient thickness to avoid the intrusion of phosphorous from the phosphosilicate glass into the silicon body 10 during subsequent emitter diffusion. This requirement is met, for example, by providing a combination of a 0.5 $\mu$-thick $SiO_2$ layer 16*a* and a 0.1$\mu$-thick phosphosilicate glass layer 16*b*. The insulator film 16 thus formed is provided with an aperture 17 shaped to an emitter region, as shown in FIG. 6, by the known photo-etching technique using photo resist, and it serves as a mask for the diffusion of emitter impurity.

Figure 7:
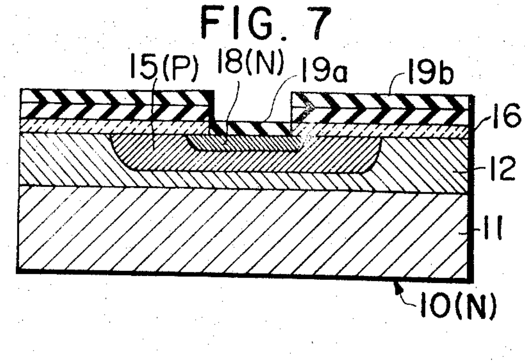

FIG. 7 shows an emitter region 18 formed by diffusing an N type impurity, for example, phosphorus through the aperture 17 into the base region 15. The emitter region 18 is formed, for example, to a width of about 2$\mu$ and a depth of about 0.3$\mu$, with a surface impurity concentration of about $6\times10^{20}$ atoms/cc. Such a region is formed by heat treatment is an oxidizing atmosphere at approximately 900° C. for about 20 minutes. During the heat treatment, phosphosilicate glass layers 19*a* and 19*b* containing phosphorus in concentrations as high as 10 to 15 mol percent are formed over the emitter region 18 and insulator film 16, respectively.

Figure 8:
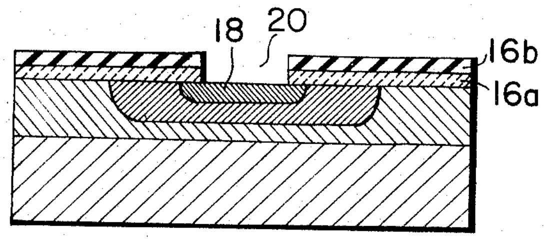

FIG. 8 shows the emitter region from which the overlying phosphoric glass layer 19*a* has been washed away to provide an aperture 20 for the emitter contact. In this case an etchant, e.g., hydrofluoric acid, is employed, whereby not only the phosphosilicate glass layer 19*a* on the emitter region but also the layer 19*b* of the same material on the insulator film 15 are washed out. In the practice of the invention, even if the etching of the glass layer 19*a* on the emitter region is carried out somewhat to an excess so that the glass layer 19*b* can be removed from the insulator film 16, the phosphosilicate glass layer 16*b* for the passivation purpose which has a low etching speed is always left on the insulator film 16. Thus, it is possible to provide the aperture for the emitter contact under the optimum etching conditions without the need of taking special care, as in the past, for leaving the passivation layer on the insulator film.

Figure 9:
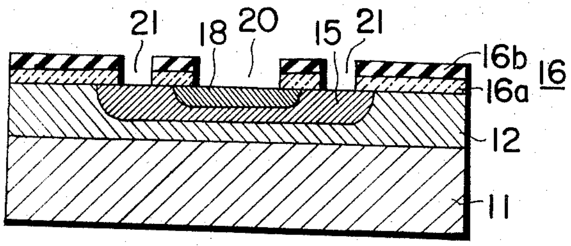

FIG. 9 shows an aperture 21 for the base contact formed through the insulator film 16 by photo-etching technique. The etching of the insulator film 16 is carried out by applying photo resist, e.g., KTFR (trade name of Kodak product), on the insulator film 16 and the emitter region 18, exposing the photo resist film excepting the portion for the base contact to a light source, and then developing the exposed film, so that the entire surface of the insulator film other than the area set aside for the base contact is covered by the photo resist so exposed to light. The etchant for the insulator film 16 may be, for example, a solution of ammonium fluoride ($NH_4F$) and hydrofluoric acid (HF) at a mixing ratio by weight of 7:1. The insulator film 16 can be processed with practically no side etching because, as already stated, the phosphorus concentration of the phosphosilicate glass layer **16*b*** is extremely low.

Figure 10:
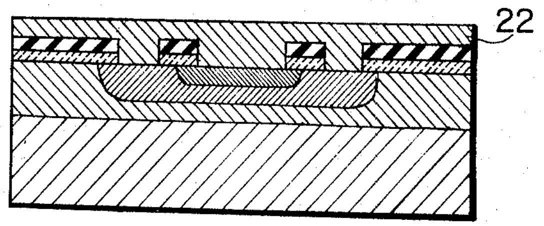
Figure 11:
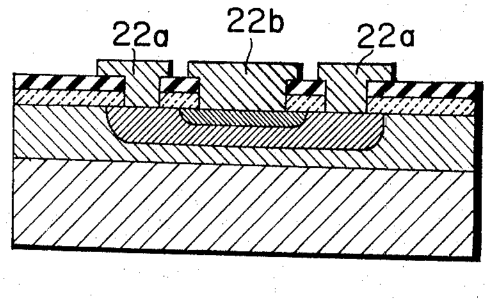

An aluminum film 22 is formed by vacuum evaporation on the surface of the silicon body 10, as shown in FIG. 10. The aluminum film 22 is then partially photo-etched, and an NPN type high frequency transistor having a base contact **22*a* and an emitter contact 22*b*** results as shown in FIG. 11.

In the manner described, a high-performance transistor having a cut-off frequency of 55 GC/sec. is obtained.

Although the present invention has so far been described in conjunction with an embodiment having an insulator film 16 of double-layer structure, i.e., a first layer **16*a* of silicon dioxide and a second layer 16*b*** of phosphosilicate glass, it should be appreciated that the phosphosilicate glass may be replaced by alumina or silicon nitride.

Further, the insulator film 16 may take a triple-layer structure composed of silicon dioxide, borosilicate glass, and phosphosilicate glass layers, laminated in the order mentioned. Such a triple-layer construction is obtained, for example, by forming a silicon dioxide layer through thermal decomposition of monosilane ($SiH_4$) gas on the surface **12*a* of the silicon body 10**, reacting monosilane gas and diborane ($B_2H_6$) gas thereby forming a borosilicate glass ($SiO_2/B_2O_3$) layer over the silicon dioxide layer, and then reacting monosilane gas and phosphine ($PH_3$) gas thereby forming a phosphosilicate glass ($SiO_2/P_2D_5$) layer thereover. The use of such an insulator film of triple-layer structure results in a reduction of the induced charge ($N_{FB}$) on the surface of the silicon body and hence a better surface passivation effect than by the film of double-layer construction.

The object of the present invention can also be attained using an insulation film 16 of a single layer of silicon nitride ($SiN_4$). Silicon nitride is capble of providing greater protection against the intrustion of impurity from the outside than that of silicon dioxide. Moreover, when used as a passivation film, it can reduce the surface induced charge, $N_{FB}$, of the semiconductor body. Further, because no such glass layer as the phosphosilicate glass which exhibits a high side etching speed is produced during the emitter diffusion over the silicon nitride film, the forming of the aperture for the base contact can be accomplished with a high degree of precision. For the etching of the silicon nitrile film phosphoric acid may be employed at a temperature of about 180° C.

As will be obvious from the foregoing description, the present invention is directed to the manufacture of a transistor having excellent properties by a method wherein an insulator film used as a mask for base diffusion is removed after the diffusion and a new insulator film having a passivation effect for the surface property of the resulting transistor is formed over the semiconductor body. Thus, the invention is of extremely beneficial value in the fabrication of high frequency transistor.

We claim:

1. A method for fabricating a transistor device which comprises:

forming an aperture in an original insulator film formed on one surface of a silicon semiconductor body, the semiconductor body having a first conductivity type and operably acting as a collector region of the transistor;

diffusing a first impurity having a second conductivity type into the semiconductor body through the aperture in the original insulator film to form a base region;

removing the original insulator film from the surface of the semiconductor body;

forming a second insulator film on the surface of the semiconductor body which has passiviation effects for the surface of the semiconductor body and which etches at a first etching rate by a prescribed etchant;

forming an aperture in the second insulator film to expose a portion of the surface of the base region;

diffusing, in an oxidizing atmosphere, a second impurity having said first conductivity type through said aperture in the second insulator film to form an emitter region in said base region, thereby forming a silicate glass layer on at least the surface of said emitter region, said silicate glass layer being etched at a second etching rate by said prescribed etchant which second rate is faster than that of said first rate of said second insulator film;

washing the surface of the semiconductor body with said prescribed etchant to remove said silicate layer thereby exposing the surface of the emitter region, the interface between said emitter region and said base region at the surface of said semiconductor body remaining protected by said second insulator film and said substrate surface remaining passivated;

forming a second aperture in the second insulator film thereby exposing the surface of the base region; and forming metal contacts through the apertures in the second insulator film with the exposed surfaces of the emitter and base regions.

2. A method for fabricating a transistor device as defined in claim 1, which further comprises slightly etching the surface of the semiconductor body to clean its face after the removal of the original insulator film and before forming the second insulator film.

3. A method for fabricating a transistor device as defined in claim 1, wherein the step of forming a second insulator film comprises forming at least two layers and wherein at least one of the layers has a passivation effect for the semiconductor surface property.

4. The method of claim 3, wherein the second insulator film is formed by first vapor depositing a layer of silicon dioxide on the surface of the semiconductor body and then forming on the silicon dioxide layer a layer of a material for passivating the surface property of the transistor.

5. The method of claim 4, wherein the second layer is formed by vapor depositing a phosphosilicate glass on said silicon dioxide layer.

6. A method for fabricating a transistor device as defined in claim 5, wherein said silicon dioxide layer is formed by thermal decomposition of monosilane, and wherein said second layer is formed by oxidation reaction of monosilane and phosphine thereby forming a phosphosilicate glass layer containing up to about 2 mol percent of phosphorus.

7. The method of claim 3, wherein the second insulating film is prepared by forming a silicon dioxide layer on the surface of the semiconductor body, forming a borosilicate glass layer on the silicon dioxide layer, and then forming a phosphosilicate glass layer on the borosilicate glass layer.

8. The method of claim 1, wherein the second insulating film is prepared by vapor depositing a silicon nitride film on the surface of the semiconductor body.

9. The method of claim 1, wherein the original insulator film is removed by etching.

10. A method for forming a transistor device comprising:
forming a silicon dioxide layer on a silicon semiconductor substrate having a first conductivity type;
forming an aperture which extends to the surface of the semiconductor substrate, in the silicon dioxide layer;
diffusing a first impurity having a second conductivity type into the semiconductor substrate through the aperture in the silicon dioxide layer to form a base region;
etching the silicon dioxide film from the surface of the semiconductor substrate;
etching the semiconductor substrate to stabilize the surface of the substrate;
vapor depositing a silicon dioxide layer on the surface of the semiconductor substrate by thermally decomposing monosilane;
forming a phosphosilicate glass layer on the vapor deposited silicon dioxide layer by reacting monosilane and phosphine, said phosphosilicate glass layer containing a prescribed amount of phosphorus, so that said phosphosilicate glass layer etches at a first etching rate by a prescribed etchant;
forming an aperture through the vapor deposited silicon dioxide and phosphosilicate glass layer to expose a portion of the surface of the base region;
diffusing, in an oxidizing atmosphere, a second impurity having said first conductivity type through the aperture in the silicon dioxide phosphosilicate glass layers into the base region to form an emitter region in said base region, thereby forming a silicate glass layer on at least the surface of said emitter region, said silicate glass layer being etched at a second etching rate by said prescribed etchant, which second rate is faster than that of said first rate of said phosphosilicate glass layer;
washing the surface of the semiconductor substrate with said prescribed etchant to remove said silicate glass layer thereby exposing the surface of the emitter region, the interface between said emitter region and said base region at the surface of said semiconductor body remaining protected by said silicon dioxide-phosphosilicate glass layer, and said substrate surface remaining passivated;
forming a second aperture in the silicon dioxide-phosphosilicate glass layers to expose a portion of the surface of the base region; and then
forming metal contacts through the apertures in the silicon dioxide-phosphosilicate glass layers with the exposed surfaces of the emitter and base regions.

11. The method of claim 10, wherein the phosphosilicate layer is formed containing up to 2 mole percent phosphorous.

12. The method of claim 10, wherein the vapor deposited silicon dioxide layer is deposited to a thickness of about $0.5\mu$.

13. The method of claim 12, wherein the phosphosilicate glass is deposited to a thickness of $0.1\mu$.

14. A method for fabricating a transistor device, which comprises the steps of:
forming a first aperture for base diffusion in an original insulator film formed on one surface of a silicon semiconductor body which has one conductivity type and operably acts as a collector region of the transistor;
diffusing a first impurity having another conductivity type opposite to said one conductivity type into the semiconductor body through said first aperture for forming a base region;
removing said original insulator film from the surface of the semiconductor body;
forming on the surface of the semiconductor body another insulator film which has passivation effects for the semiconductor body surface and which etches at a first etching rate by a prescribed etchant;
forming a second aperture for emitter diffusion in another insulator film to expose a part of the surface of said base region;
diffusing, in an oxidizing atmosphere, a second impurity having said one conductivity type for forming an emitter region within the base region through said second aperture, whereby during this diffusion process an oxide layer is being formed on the surface of the emitter region, said oxide layer being etched at a second etching rate by said prescribed etchant, which second rate is faster than that of said first rate of said another insulating film;
washing the surface of the semiconductor body with an etchant to remove said oxide layer from the surface of the emitter region, the interface between said emitter region and said base region at the surface of said semiconductor body remaining protected by said another insulator film, and said substrate surface remaining passivated;
forming a third aperture for a base contact in said another insulator film to expose the surface of the base region; and
providing metal contacts through said second and third apertures onto the exposed surfaces of said emitter and base regions to thereby obtain a transistor device.

15. A method for fabricating a transistor device as defined in claim 14, which further comprises the step of slightly etching the surface of said semiconductor body after the step of removing said original insulator film from the surface of the semiconductor body so that said semiconductor body presents its clean etched face, whereby said another insulator film is then formed on said clean etched face of said semiconductor body, resulting in increasing the passivation effect of said another insulator film with respect to the surface property of the transistor.

16. A method for fabricating a transistor device as defined in claim 14, wherein said another insulator film has a multilayer construction containing therein at least one layer for passivating the surface property of the transistor.

17. A method of fabricating a transistor device as defined in claim 16, wherein said another insulator film of a multilayer construction consists of a first and a second layers, the first layer being of silicon dioxide which is chemically vapor deposited on the surface of said semiconductor body, the second layer being an appropriate layer for passivating the surface property of the transistor and formed on said first layer.

18. A method for fabricating a transistor device as defined in claim 17, wherein said second layer is of phosphosilicate glass chemically vapor deposited on said first layer.

19. A method for fabricating a transistor device as defined in claim 18, wherein said first layer is formed by thermal decomposition of monosilane, and wherein said second layer is formed by oxidation reaction of monosilane, and wherein said second layer is formed by oxidation reaction of monosilane and phosphine so that a produced phosphosilicate glass layer may contain up to 2 mol percent of phosphorus.

20. A method for fabricating a transistor device as defined in claim 16, wherein said another insulator film is a combination film of a silicon dioxide layer, a borosilicate glass layer and a phosphosilicate glass layer formed in turn on the semiconductor body.

21. A method for fabricating a transistor device which comprises:
forming an aperture in an original insulator film formed on one surface of a silicon semiconductor body, the semiconductor body having a first conductivity type and operably acting as a collector region of the transistor;

diffusing in an oxidizing atmosphere a first impurity having a second conductivity type into the semiconductor body through the aperture in the original insulator film to form a base region, whereby a first oxide layer is formed at least on the surface of the base region;

removing the original insulator film and the first oxide layer from the surface of the semiconductor body;

forming a second insulator film on the surface of the semiconductor body which has passivation effects for the surface of the semiconductor body, and which etches at a first etching rate by a prescribed etchant;

forming an aperture in the second insulator film to expose a portion of the surface of the base region;

diffusing in an oxidizing atmosphere a second impurity having said first conductivity type through said aperture in the second insulator film to form an emitter region in said base region, whereby a second oxide layer is formed on at least the surface of the emitter region, said second oxide layer being etched at a second etching rate by said prescribed etchant which second rate is faster than that of said rate of said second insulator film;

washing the surface of the semiconductor body with an etchant to remove the second oxide layer thereby exposing the surface of the emitter region, the interface between said emitter region and said base region at the surface of said semiconductor body remaining protected by said second insulator film, and said substrate surface remaining passivated;

forming a second aperture in the second insulator film thereby exposing the surface of the base region; and forming metal contacts through the apertures in the second insulator film with the exposed surfaces of the emitter and base regions.

22. A method for forming a transistor device comprising:

forming a silicon dioxide layer on a silicon semiconductor substrate having a first conductivity type;

forming an aperture which extends to the surface of the semiconductor substrate, in the silicon dioxide layer;

diffusing in an oxidizing atmosphere a first impurity having a second conductivity type into the semiconductor substrate through the aperture in the silicon dioxide layer to form a base region whereby a first oxide layer is formed covering at least the base region;

etching the silicon dioxide film and the first oxide layer from the surface of the semiconductor substrate;

etching the semiconductor substrate to stabilize the surface of the substrate;

vapor depositing a silicon dioxide layer on the surface of the semiconductor substrate by thermally decomposing monosilane;

forming a phosphosilicate glass layer on the vapor deposited silicon dioxide layer by reacting monosilane and phosphine, said phosphosilicate glass layer containing a prescribed amount of phosphorus so that said phosphosilicate glass layer etches at a first etching rate by a prescribed etchant;

forming an aperture through the vapor deposited silicon dioxide and phosphosilicate glass layer to expose a portion of the surface of the base region;

diffusing in an oxidizing atmosphere a second impurity having said first conductivity type through the aperture in the silicon dioxide-phosphosilicate glass layers into the base region to form an emitter region in said base region, whereby a second oxide film is formed on at least the surface of the emitter region, said second oxide film being etched at a second etching rate by said prescribed etchant, which said second rate is faster than that of said first etching rate of said phosphosilicate glass layer;

washing the surface of the semiconductor substrate with an etchant to remove the second oxide layer thereby exposing the surface of the emitter region, the interface between said emitter rgion and said base region at the surface of said semiconductor body remaining protected by said silicon dioxide-phosphosilicate glass layers, and said substrate surface remaining passivated;

forming a second aperture in the silicon dioxide-phosphosilicate glass layers to expose a portion of the surface of the base region; and then forming metal contacts through the apertures in the silicon dioxide-phosphosilicate glass layers with the exposed surfaces of the emitter and base regions.

References Cited

UNITED STATES PATENTS

| | | | |
|---|---|---|---|
| 3,472,689 | 10/1969 | Scott | 117—212 |
| 3,476,619 | 11/1969 | Tolliver | 148—187 |
| 3,477,886 | 11/1969 | Ehlenberger | 148—187 |
| 3,489,622 | 1/1970 | Barson et al. | 148—187 |
| 3,497,407 | 2/1970 | Esch et al. | 156—17 |
| 3,404,451 | 10/1968 | So | 148—187 X |
| 3,334,281 | 8/1967 | Ditrick | 317—235 |
| 3,503,813 | 3/1970 | Yamamoto | 148—188 X |
| 3,343,049 | 9/1967 | Miller et al. | 317—234 |
| 3,398,029 | 8/1968 | Yasufuku et al. | 148—187 X |
| 3,437,533 | 4/1969 | Dingwall | 148—187 |
| 3,457,125 | 7/1969 | Kerr | 148—187 |
| 3,460,003 | 8/1969 | Hampikan et al. | 317—234 |
| 3,481,781 | 12/1969 | Kern | 117—106 X |
| 3,490,964 | 1/1970 | Wheeler | 148—187 |
| 3,507,716 | 4/1970 | Nishida et al. | 148—187 |

FOREIGN PATENTS

| | | | |
|---|---|---|---|
| 1,190,983 | 5/1968 | Japan | 148—187 |

OTHER REFERENCES

Kerr et al.: "Stabilization of $SiO_2$ passivation layers with $P_2O_5$," IBM Journal, September 1964, pp. 376–384.

L. DEWAYNE RUTLEDGE, Primary Examiner
W. G. SABA, Assistant Examiner

U.S. Cl. X.R.

117—201, 212, 215; 148—186,188; 156—17; 317—235 R